(12) United States Patent
England et al.

(10) Patent No.: US 10,381,304 B2
(45) Date of Patent: Aug. 13, 2019

(54) INTERCONNECT STRUCTURE

(71) Applicant: GLOBALFOUNDRIES INC., Grand Cayman (KY)

(72) Inventors: Luke England, Saratoga Springs, NY (US); Mark W. Kuemerle, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 5 days.

(21) Appl. No.: 15/664,484

(22) Filed: Jul. 31, 2017

(65) Prior Publication Data

US 2019/0035731 A1 Jan. 31, 2019

(51) Int. Cl.
*H01L 21/768* (2006.01)
*H01L 23/522* (2006.01)
*H01L 23/525* (2006.01)
*H01L 23/528* (2006.01)

(52) U.S. Cl.
CPC .... *H01L 23/5256* (2013.01); *H01L 21/76892* (2013.01); *H01L 23/528* (2013.01); *H01L 23/5226* (2013.01)

(58) Field of Classification Search
CPC ........... H01L 23/5256; H01L 21/76892; H01L 23/528
See application file for complete search history.

(56) References Cited

U.S. PATENT DOCUMENTS

| 2010/0182041 | A1 | 7/2010 | Feng et al. |
| 2011/0110064 | A1 | 5/2011 | Foster, Sr. et al. |
| 2011/0297912 | A1* | 12/2011 | Samachisa ........... G11C 13/003 257/5 |
| 2014/0264832 | A1* | 9/2014 | Meyer ..................... H01L 24/17 257/737 |
| 2016/0225679 | A1* | 8/2016 | Kannan .................... H01L 22/14 |
| 2018/0025789 | A1* | 1/2018 | Dono ..................... G11C 29/38 714/719 |

FOREIGN PATENT DOCUMENTS

| TW | 201044534 | 12/2010 |
| TW | 201207855 | 2/2012 |
| TW | 201320310 | 5/2013 |

OTHER PUBLICATIONS

Taiwanese Office Action and Search Report in related TW Application No. 106137196 dated Apr. 30, 2018, 12 pages.
Taiwanese Notice of Allowance in related TW Application No. 106137196 dated Nov. 9, 2018, 4 pages.

* cited by examiner

*Primary Examiner* — Bilkis Jahan
*Assistant Examiner* — Victor V Barzykin
(74) *Attorney, Agent, or Firm* — David Cain; Andrew M. Calderon; Roberts Mlotkowski Safran Cole & Calderon

(57) ABSTRACT

The present disclosure relates to semiconductor structures and, more particularly, to an interconnect structure to connect between different package configurations and methods of manufacture. The structure includes an interconnect comprising a plurality of conductive levels and columns configured into a grid pattern within an insulator material, the plurality of conductive levels and columns aligned to connect to different package configurations; and a control circuit that provides a signal to the interconnect to connect to a combination of the different package configurations.

20 Claims, 5 Drawing Sheets

INTERCONNECT STRUCTURE

FIELD OF THE INVENTION

The present disclosure relates to semiconductor structures and, more particularly, to an interconnect structure to connect between different package configurations and methods of manufacture.

BACKGROUND

An area of computer technology, amongst others, that undergoes continual advancement is packaging of integrated circuits. Packaging of integrated circuits into a confined space is becoming more difficult as many devices continue to shrink in size or need to communicate with more chips which use different connection technologies. An example of different connection technologies includes through silicon vias (TSV) and micropillars, which are used for different package configurations. Package configurations can include, e.g., 2D, 2.5D, 3D, etc.

Typically, a single connection design is used for a single package configuration. This results in many different connection designs for the many different package configurations, making it very difficult to assemble modules that comprise the different package configurations. In addition, this requires redesign of the same circuit for each different configuration, resulting in added costs, as well as costly manufacturing and design considerations.

SUMMARY

In an aspect of the disclosure, a structure comprises an interconnect comprising a plurality of conductive levels and columns configured into a grid pattern within an insulator material, the plurality of conductive levels and columns aligned to connect to different package configurations; and a control circuit that provides a signal to the interconnect to connect to a combination of the different package configurations.

In an aspect of the disclosure, an interconnect structure comprises: a back end of the line interconnect comprising a conductive grid pattern comprising a plurality of columns configured to connect to different package configurations; and a control circuit with programmable fuses associated with the different package configurations and which, upon being blown, connect the back end of the line interconnect to any combination of the different package configurations.

In an aspect of the disclosure, a process comprises: fabricating a control circuit and interconnect structure; determining which type(s) of package configuration will be used in a module assembly; and blowing an appropriate fuse(s) of the control circuit for an intended package type used in the module assembly such that the interconnect structure makes an electrical connection to the intended package type.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an interconnect structure to connect between different package configurations and methods of manufacture. More specifically, the present disclosure relates to a 3-D interconnect column for dual I/O circuit connections and methods of manufacture. By way of example, in embodiments, the interconnect structure described herein can advantageously be implemented with both through silicon via (TSV) and non-TSV packages.

In embodiments, the interconnect structure described herein comprises a backend-of-the-line (BEOL) interconnect column that directly electrically connects to both TSV I/Os and micropillar I/Os aligned in a die layout. Although the interconnect structure is electrically connected to the I/O circuit (e.g., TSV I/Os and/or micropillar I/Os), it can also be electrically isolated from other BEOL wirings by insulating material. In addition, the interconnect column can be paired with a control circuit that sets I/Os for 2.5D and/or 3D package configurations. A fuse blow process during wafer probe/test can be used to program the control circuit.

Advantageously, by implementing the interconnect structure described herein, it is now possible to use a single interconnect structure for different package configurations (i.e., 2D, 2.5D, 3D), without any redesign. The use of the single interconnect structure for different package configurations saves considerable engineering resources, as well as eliminates the need for additional design, characterization, and qualification processes for each different package type and hence provides faster time to market for new products. In addition, the single interconnect structure described herein fits within existing technology design rules.

The interconnect structure of the present disclosure can be manufactured in a number of ways using a number of different tools. In general, though, the methodologies and tools are used to form structures with dimensions in the micrometer and nanometer scale. The methodologies, i.e., technologies, employed to manufacture the interconnect structure of the present disclosure has been adopted from integrated circuit (IC) technology. For example, the interconnect structure can be built on wafers and realized in films of material patterned by photolithographic processes. In particular, the fabrication of the interconnect structure uses three basic building blocks: (i) deposition of material, (ii) applying a patterned mask by photolithographic imaging, and (iii) etching the materials selectively to the mask.

Figure 1:
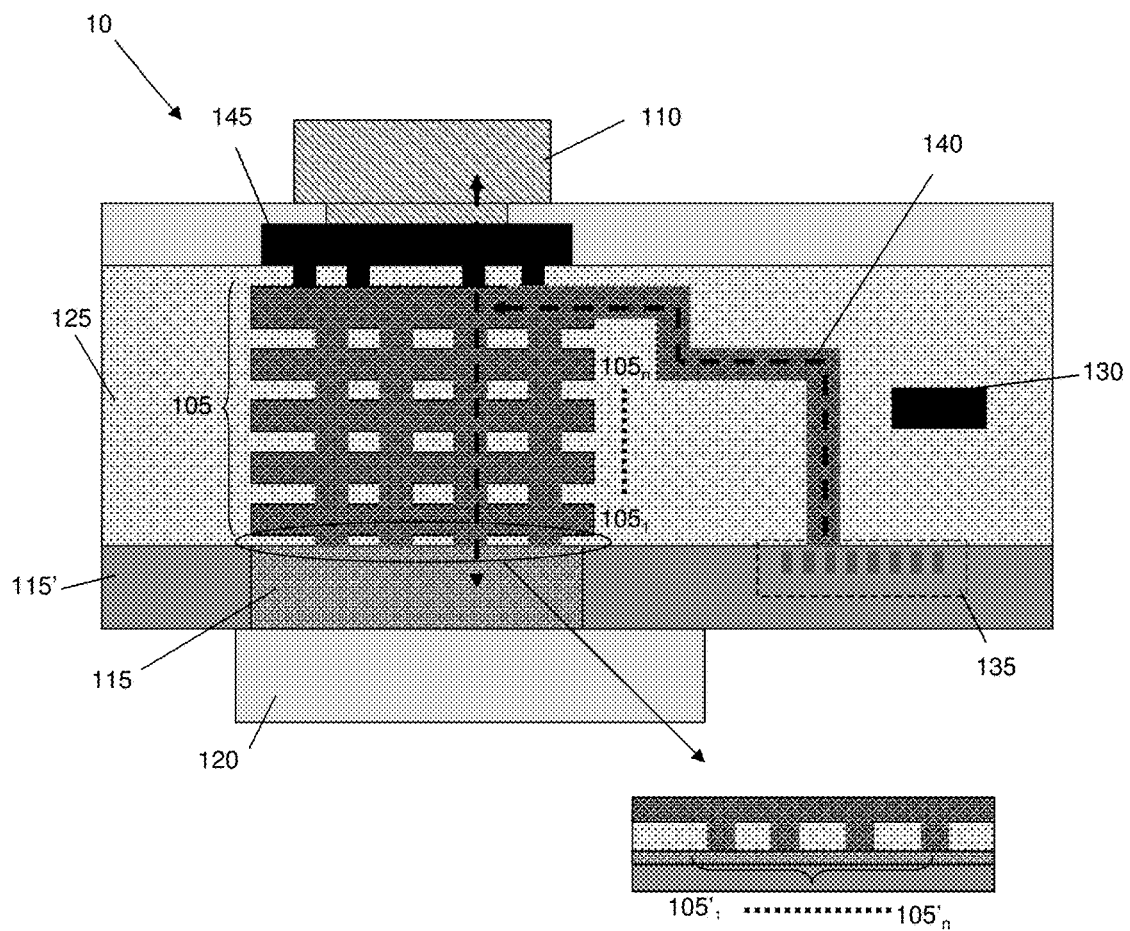
FIG. 1 shows an interconnect structure, amongst other features, and respective fabrication processes in accordance with aspects of the present disclosure.

FIG. 1 shows an interconnect structure, amongst other features, and respective fabrication processes in accordance with aspects of the present disclosure. In particular, the structure 10 includes an interconnect structure 105 configured into a grid pattern, which electrically connects different package configurations 110 and 115 (using a control circuit 135). The different package configurations 110 and 115 can include I/O connections aligned in the same x-y locations, as an example, and directly electrically connected to the interconnect structure 105. In this way, it is now possible to control electrical connections between different package configurations with a single control circuit, as further described herein.

In embodiments, the package configuration 110 includes a micropillar connected to the interconnect structure 105 by a cap layer 145, e.g., aluminum. In embodiments, the package configuration 110, e.g., micropillar, can be electrically wired to another target device. The package configuration 115, on the other hand, includes a TSV connection, which is electrically connected to, for example, a high bandwidth memory (HBM) stack 120. It should be understood by those of skill in the art that by using the interconnect structure 105 described herein, any combination of different package configurations (i.e., 2D, 2.5D, 3D, single-chip module (SCM), multi-chip module (MCM), etc.) can be electrically connected together with the configurations shown in FIG. 1 are exemplary illustrations. In embodiments, the TSV 115 is formed in a substrate 115' composed of any suitable material including, but not limited to, Si, SiGe, SiGeC, SiC, GE alloys, GaAs, InAs, InP, and other III/V or II/VI compound semiconductors.

Still referring to FIG. 1, the interconnect structure 105 is a backend-of-the-line (BEOL) stack comprising a plurality of rows (e.g., levels) $105_1$-$105_n$ and a plurality of columns $105'_1$-$105'_n$. In embodiments, the plurality of rows $105_1$-$105_n$ and columns $105'_1$-$105'_n$ can be composed of conductive material formed in insulating material 125. The conductive material can be, for example, any conductive material used for interconnect structures including, e.g., tungsten, aluminum, copper, etc. Also, the insulating material 125 can be any interlevel dielectric material, e.g., $SiO_2$, deposited using conventional deposition processes, e.g., chemical vapor deposition (CVD) processes. It should also be understood by those of skill in the art that the interconnect structure 105 can be electrically isolated from other BEOL structures, represented generally at reference numeral 130, by the insulating material 125.

In embodiments, the interconnect structure 105 can be formed, e.g., level by level, by conventional lithography, etching and deposition processes including, e.g., dual damascene processes to form each level and a respective portion of the plurality of columns. For example, after each layer of insulator material 125 is deposited, a resist formed over the insulator material 125 is exposed to energy (light) to form a pattern (openings). An etching process with a selective chemistry, e.g., reactive ion etching (RIE), will be used to form one or more trenches and vias in the insulator material 125 through respective openings of the resist (and other hardmask materials needed to form the structures as is well known in the art). The resist can then be removed by a conventional oxygen ashing process or other known stripants. Following the resist removal, the conductive material can be deposited by any conventional deposition processes, e.g., chemical vapor deposition (CVD) processes. Any residual material on the surface of the insulator material 125 can be removed by conventional chemical mechanical polishing (CMP) processes. This process can then be repeated to form the plurality of levels $105_1$-$105_n$ and columns $105'_1$-$105'_n$.

As further shown in FIG. 1, the interconnect structure 105 is electrically connected to a control circuit 135 by a wiring structure 140. Although the wiring structure 140 is shown connected to the uppermost level $105_n$ of the interconnect structure 105, it should be recognized that the wiring structure 140 can electrically connect to any column $105'_1$ . . . $105'_n$ or level $105_1$ . . . $105_n$ of the interconnect structure 105. Similar to that which was described with the respect to the interconnect structure 105, the wiring structure 135 can be formed by conventional lithography, etching and deposition processes. In one contemplated aspect, for example, the wiring structure 140 and the interconnect structure 105 can be formed during the same processing steps with the same conductive materials.

In embodiments, the control circuit 135 includes a function to switch between any combination of the different package configurations 110 and 115, e.g., TSV or micropillar configurations, to optimize for different signal lengths. For example, the control circuit 135 can include a programmable fuse used to control the I/O circuit to optimize power or signal integrity, as well as to indicate which package configurations are to be connected within the module, e.g., electrically connected. In this way, the control circuit 135 can provide a control signal (as indicated by the dashed arrow) to control the I/O circuit which, in the embodiment shown in FIG. 1, provides electrical connection to both the package configurations 110, 115.

Figure 2:
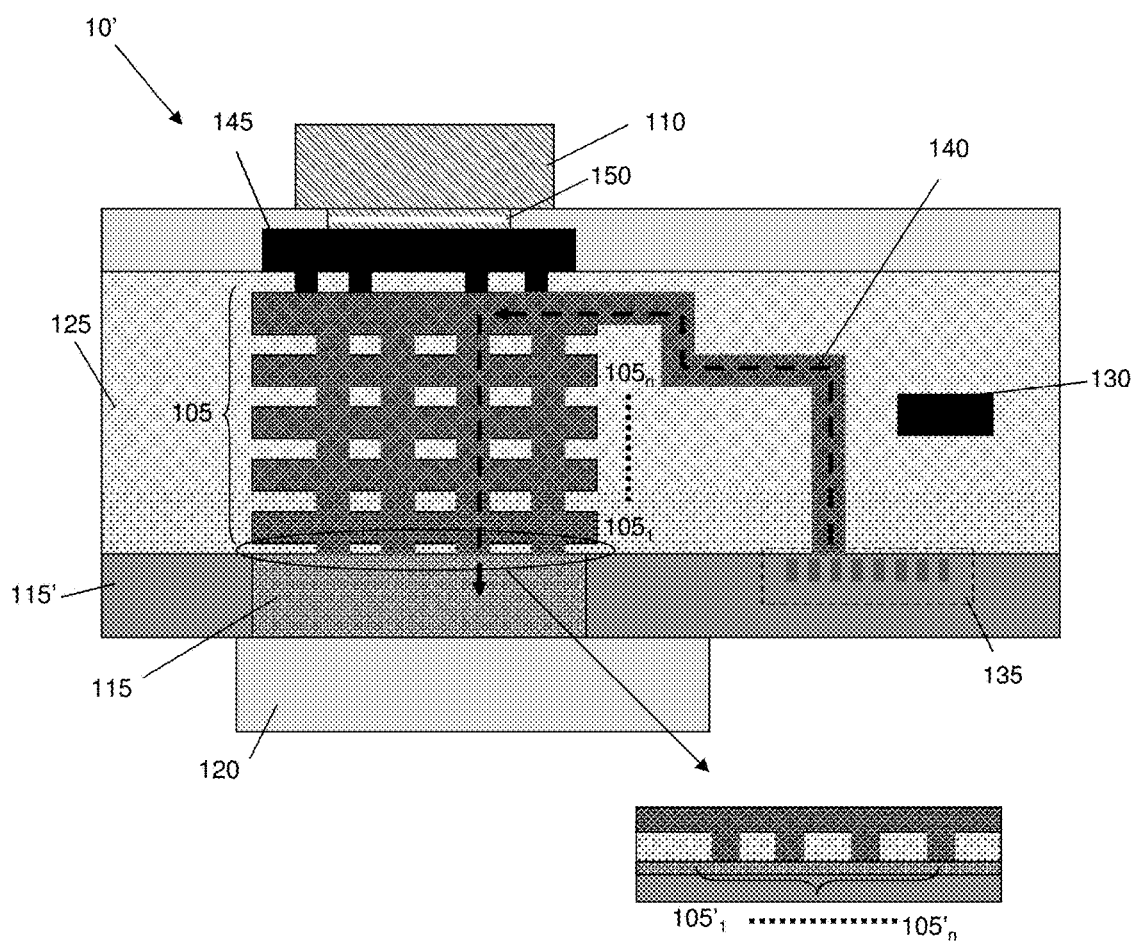
FIG. 2 shows an interconnect structure, amongst other features, and respective fabrication processes in accordance with additional aspects of the present disclosure.

FIG. 2 shows an interconnect structure, amongst other features, and respective fabrication processes in accordance with additional aspects of the present disclosure. In particular, the structure 10' shown in FIG. 2 includes a dummy pad 150 which can be located on either opposing dies, e.g., cap layer 145 or insulating material 125. The dummy pad 150 will electrically isolate the package configuration 110 from the interconnect structure 105 and the package configuration 115. In this way, the electrical signal (e.g., I/O connection) will be forced to the package configuration 115.

Figure 3:
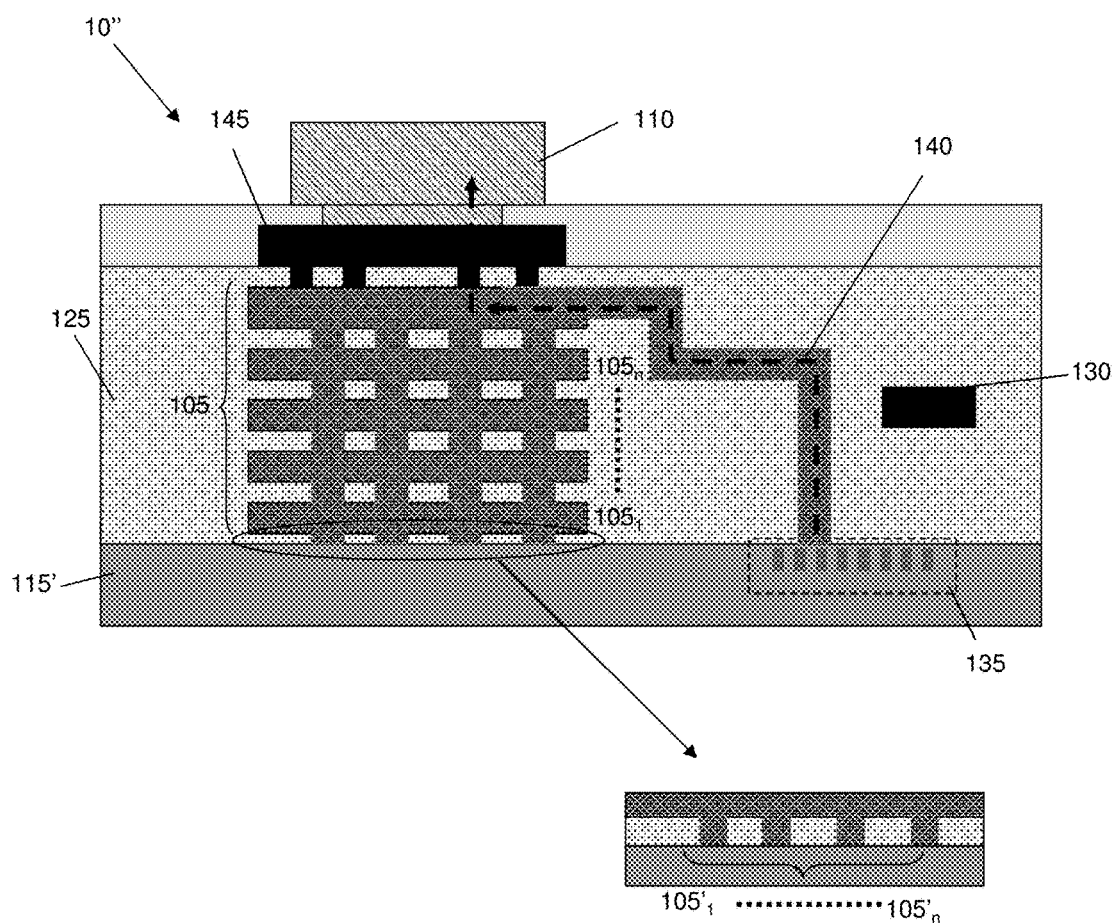
FIG. 3 shows an interconnect structure, amongst other features, and respective fabrication processes in accordance with additional aspects of the present disclosure.

FIG. 3 shows an interconnect structure, amongst other features, and respective fabrication processes in accordance with additional aspects of the present disclosure. In particular, the structure 10" shown in FIG. 3 does not include the package configuration 115. Accordingly, in this additional aspect, the electrical signal (e.g., I/O connection) will be forced to the package configuration 110.

Figure 4:
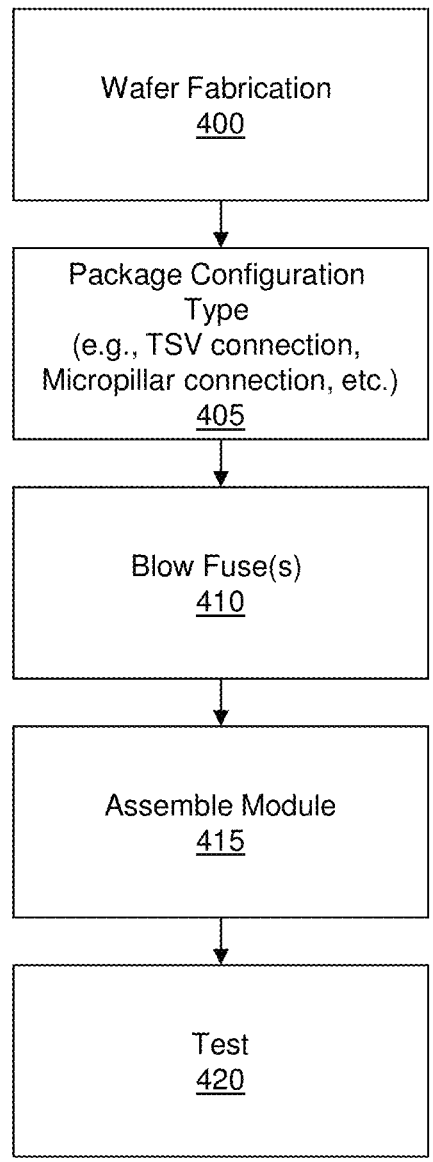
FIG. 4 is a programming flow chart in accordance with aspects of the present disclosure.

FIG. 4 is a programming flow chart in accordance with aspects of the present disclosure. More specifically, FIG. 4 shows the steps to program the control circuit in order to tune a packaged chip or device, e.g., control IO circuit to optimize power or signal integrity. At step 400, the control circuit and interconnect structure, amongst other features, are fabricated at a wafer fabrication facility. In embodiments, the control circuit will include one or more fuses which may be blown, as is known in the art. At step 405, a determination is made as to which type(s) of package configuration will be used in the assembly of a module, e.g., 3D, single-chip module (SCM), multi-chip module (MCM), 2.5D, etc. At step 410, an appropriate fuse(s) is blown based on the intended package type used in the module. At step 415, the module, e.g., package type(s), is assembled and, at step 420, a module final test is conducted.

Figure 5:
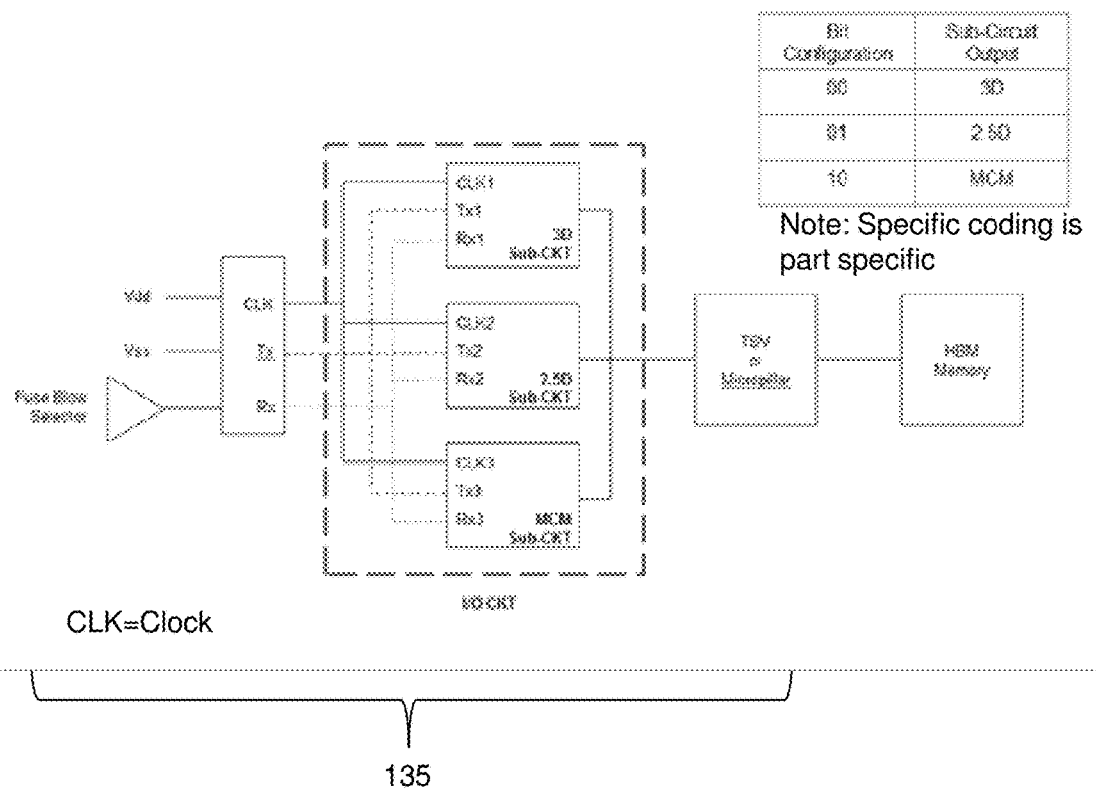
FIG. 5 shows an example Tx-Rx Schematic for a high bandwidth memory (HBM) implementation in accordance with aspects of the present disclosure.

FIG. 5 shows an example Tx-Rx Schematic for an HBM memory implementation in accordance with aspects of the present disclosure. Note that not all functions are shown for simplicity. More specifically, FIG. 5 show the control circuit 135 with three different fuses for, e.g., CLK1, CLK2, CLK3. As should be understood by those of skill on the art, the three different fuses are related to connections for different types of configurations, e.g., 3D, 2.5, MCM configurations. By blowing a respective fuse (e.g., in accordance with an e-fuse encoding table), it is possible to make a connection to any of the different configurations using the interconnect structure described herein. In embodiments, the different package configurations can also share a clock or have a separate clock for each package configuration type.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   an interconnect comprising a plurality of conductive levels and columns configured into a grid pattern within an insulator material, the plurality of conductive levels and columns aligned to connect to different package configurations with different connection technologies; and
   a control circuit which includes programmable fuses associated with the different package configurations with the different connection technologies and which is configured to provide a control signal to the interconnect to connect the interconnect to any combination of the different package configurations with the different connection technologies.

2. The structure of claim 1, wherein the different package configurations include 2D, 2.5D and 3D configurations.

3. The structure of claim 1, wherein the different connection technologies include a micropillar connection and a through silicon via (TSV) connection.

4. The structure of claim 1, wherein the control circuit is connected to any level of the interconnect.

5. The structure of claim 4, wherein the interconnect is isolated from back end of the line wirings.

6. The structure of claim 3, further comprising a dummy pad located between the micropillar and the interconnect to force an I/O connection to a different package configuration.

7. The structure of claim 1, wherein the conductive levels and columns comprises a conductive material composed of one of aluminum, copper and tungsten.

8. The structure of claim 1, wherein the interconnect is a back end of the line structure.

9. An interconnect structure comprising:
   a back end of the line interconnect comprising a conductive grid pattern comprising a plurality of columns configured to connect to different package configurations with different connection technologies; and
   a control circuit with programmable fuses associated with the different package configurations with the different connection technologies and which, upon being blown, connect the back end of the line interconnect to any combination of the different package configurations with the different connection technologies.

10. The interconnect structure of claim 9, wherein the different package configurations include 2D, 2.5D and 3D configurations which use different connection technologies.

11. The interconnect structure of claim 10, wherein the different connection technologies include at least one of a micropillar connection and a through silicon via (TSV) connection.

12. The interconnect structure of claim 11, wherein the control circuit is connected to any level of the back end of the line interconnect.

13. The interconnect structure of claim 11, wherein the back end of the line interconnect is isolated from back end of the line wirings.

14. The interconnect structure of claim 9, further comprising a dummy pad located between a micropillar of one the different package configurations and the back end of the line interconnect to force an I/O connection to a different package configuration.

15. The interconnect structure of claim 9, wherein the different package configurations include at least a single-chip module (SCM) and a multi-chip module (MCM).

16. A process comprising:
    fabricating a control circuit and interconnect structure comprising a conductive grid pattern comprising a plurality of columns configured to connect to different package configurations with different connection technologies;
    determining which type(s) of package configuration will be used in a module assembly; and
    blowing an appropriate fuse(s) of the control circuit for an intended package type used in the module assembly such that the interconnect structure makes an electrical connection to the intended package type.

17. The process of claim 16, further comprising testing the module assembly.

18. The process of claim 16, wherein the intended package type is at least one of a 3D, single-chip module (SCM), multi-chip module (MCM), 2.5D and 2D package type.

19. The interconnect structure of claim 1, wherein the control circuit includes a plurality of programmable fuses each of which are related to connections for the different connection technologies and further comprising a dummy pad that electrically isolates the different package configurations from the interconnect.

20. The interconnect structure of claim 9, wherein the control circuit includes a plurality of programmable fuses each of which are related to connections for the different connection technologies and further comprising a dummy pad that electrically isolates the different package configurations from the interconnect.

* * * * *